United States Patent
Tomita

(10) Patent No.: US 7,633,818 B2
(45) Date of Patent: Dec. 15, 2009

(54) TEST METHOD FOR SEMICONDUCTOR MEMORY DEVICE AND SEMICONDUCTOR MEMORY DEVICE THEREFOR

(75) Inventor: Hiroyoshi Tomita, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 75 days.

(21) Appl. No.: 11/892,358

(22) Filed: Aug. 22, 2007

(65) Prior Publication Data

US 2008/0056032 A1    Mar. 6, 2008

(30) Foreign Application Priority Data

Aug. 31, 2006    (JP)  ............................. 2006-235750

(51) Int. Cl.
*G11C 7/00*    (2006.01)
(52) U.S. Cl. ..................... 365/201; 365/203; 365/207; 365/206
(58) Field of Classification Search ................. 365/201, 365/203, 206, 207
See application file for complete search history.

(56) References Cited

U.S. PATENT DOCUMENTS

| | | | | |
|---|---|---|---|---|
| 6,377,499 B1 * | 4/2002 | Tobita | ......................... | 365/222 |
| 6,385,103 B1 * | 5/2002 | Endo | ........................... | 365/201 |
| 6,388,934 B1 * | 5/2002 | Tobita | ......................... | 365/222 |
| 6,434,065 B1 * | 8/2002 | Kobayashi et al. | .......... | 365/200 |
| 6,449,204 B1 * | 9/2002 | Arimoto et al. | ............. | 365/222 |
| 6,551,846 B1 * | 4/2003 | Furutani et al. | ............... | 438/17 |
| 7,139,208 B2 * | 11/2006 | Arimoto et al. | ............. | 365/222 |

FOREIGN PATENT DOCUMENTS

| | | |
|---|---|---|
| EP | 0 947 994 A2 | 10/1999 |
| JP | 4-1999 A | 1/1992 |
| JP | 04-001999 A | 1/1992 |
| JP | 2004-145931 A | 5/2004 |
| WO | 2004/079745 A1 | 9/2004 |
| WO | WO 2004/079745 A1 | 9/2004 |

OTHER PUBLICATIONS

Li-Fu Chang, et al, "DRAM Bit-line Coupling Noise Analysis and Simulation of Process Sensitivity for COB Scheme," Computational Electronics, 1998, IWCE-6, Extended Abstracts of 1998 Sixth International Workshop on Osaka, Japan, Oct. 19-21, 1998, Piscataway NJ, USA, IEEE, pp. 186-189.

* cited by examiner

Primary Examiner—Viet Q Nguyen
(74) Attorney, Agent, or Firm—Arent Fox LLP.

(57) ABSTRACT

The present invention detects a sense amplifier having an unbalanced characteristic. In a test method for a semiconductor memory device for detecting a sense amplifier having an unbalanced characteristic, an intermediate potential having different H and L levels from normal operation is restored in a first memory cell of a first bit line connected to a test target sense amplifier, charge quantity when the capacitance of the capacitor is small is virtually stored in the first memory cell, then the data of the first memory cell is read, and a malfunction of the sense amplifier is checked based on the presence of an error of read data.

10 Claims, 15 Drawing Sheets

TEST METHOD FOR SEMICONDUCTOR MEMORY DEVICE AND SEMICONDUCTOR MEMORY DEVICE THEREFOR

CROSS-REFERENCE TO RELATED APPLICATIONS

This application is based upon and claims the benefit of priority from the prior Japanese Patent Application No. 2006-235750, filed on Aug. 31, 2006, the entire contents of which are incorporated herein by reference.

BACKGROUND OF THE INVENTION

1. Field of the Invention

The present invention relates to a test method for a semiconductor memory device and the semiconductor memory device therefor, and more particularly to a test method for detecting a sense amplifier which has an unbalanced characteristic, and the semiconductor memory device therefor.

2. Description of the Related Art

Among semiconductor memory devices, Dynamic RAM (DRAM) and pseudo-SRAM which automatically refreshes internally, are facing a problem where the failure of a memory cell and sense amplifier, which are not due to a process failure, are generated as memory capacity increases and size decreases.

As memory capacity increases and size decreases in semiconductor memory devices, the capacitance of the memory cell tends to decrease and the capacitance between adjacent bit lines tend to increase. And dispersion among memory cells increases, and the unbalanced characteristic of the sense amplifier becomes conspicuous. The unbalanced characteristic of a sense amplifier means that the characteristic between a P-channel transistor pair becomes uneven, and/or the characteristic between an N-channel transistor pair becomes uneven in a sense amplifier comprised of a pair of CMOS inverters where input and output are cross-connected. The miniaturization of elements increases the probability of defects concentrating to a specific transistor element, so the characteristic dispersion among transistor elements, not due to manufacturing process, occurs.

In the case of a DRAM, 1 and 0 of data are stored depending on whether charge is stored or not in a capacitor of a memory cell. The charge stored in the capacitor is lost by leak current as time elapses. Therefore in a DRAM, a refresh operation is performed periodically in which memory cells are read and the same data is written again. If the capacitance of a memory cell becomes small due to the increase of memory capacity and miniaturization of the device, the stored charge is lost by leak current in a short time, so the cycle of refresh operation must be shorter. However decreasing the cycle of the refresh operation causes an increase of power consumption, which is not desirable.

Therefore a memory cell of which capacitance of the capacitor of the cell is small and leak current is large, is rejected (excluded) as a failure bit in the refresh operation test, since the stored charge is lost in a short time in such a memory cell.

International Publication, WO 2004/079745 A1 states that when a refresh operation test is performed, the operation test is performed with artificially decreasing the capacitance of the capacitor of the cell. In this patent document, one word line is selected, the sense amplifier is activated, and the bit line pair is amplified, then other word lines are selected in a state where the sense amplifier is deactivated, and an intermediate potential is generated in the bit lines.

Japanese Patent Application Laid-Open No. H04-001999 states that in test mode, an intermediate potential is written in memory cells with setting the word line drive level lower than normal operation time, and the margin of the sense amplifier is checked.

SUMMARY OF THE INVENTION

As mentioned above, the unbalanced characteristic of the sense amplifier becomes a problem due to larger memory capacity and miniaturization of the DRAM. A sense amplifier is a latch circuit comprised of a pair of CMOS inverters, and if the P-channel transistor pair or the N-channel transistor pair has an unbalanced characteristic, the potential difference of the bit line pair changed by the charge of the capacitor of the memory cell cannot be correctly detected when the potential difference does not become sufficiently high.

Even if a serious failure, such as an operation margin of the sense amplifier becoming insufficient, as shown in Japanese Patent Application Laid-Open No. H04-001999, does not occur, the slightly unbalanced characteristic of the sense amplifier causes an operation failure of the sense amplifier if the capacitance of the capacitor of the memory cell is small and there is a data pattern in which the sense amplifier operation is affected by adjacent bit lines and adjacent sense amplifiers.

In other words, in a memory cell array of a DRAM, a bit line is capacity-coupled with an adjacent bit line, and a sense amplifier is also capacity-coupled with an adjacent sense amplifier. Therefore in a read operation, the operation of the sense amplifier is affected by the change of potential of the adjacent bit lines and adjacent sense amplifiers, and the affect is strongest when the combination of the data of the adjacent columns is worst, and the probability of a malfunction becomes high. If the capacitance of the capacitor of the memory cell is small, the probability of a malfunction of the sense-amplifier becomes high. If the sense amplifier has a slight unbalanced characteristic and if cross-talk noise, due to capacity coupling generated from adjacent bit lines or adjacent sense amplifiers, is generated, and the capacitance of the capacitor of the memory cell is small, a malfunction of the sense amplifier occurs.

As mentioned above, in the refresh operation test, a memory cell of which capacitance of the capacitor is small and leak current is large can be detected as an operation failure, but a memory cell of which capacitance of the capacitor is small and leak current is small may not be detected. If such a memory cell is combined with a sense amplifier having an unbalanced characteristic, an operation failure occurs in the case of a worst data combination. Therefore some method to reject a sense amplifier having an unbalanced characteristic is necessary.

With the foregoing in view, it is an object of the present invention to provide a test method for a semiconductor memory device that can detect a sense amplifier having an unbalanced characteristic which may cause a read operation failure, and the semiconductor memory device thereof.

To achieve the above object, a first aspect of the present invention provides a test method for a semiconductor memory device for detecting a sense amplifier having an unbalanced characteristic, wherein an intermediate potential different from H and L levels in normal operation time is restored in a first memory cell of a first bit line connected to a test target sense amplifier, so that the charge quantity in the case of when the capacitor is virtually small, is stored in the first memory cell, then the data in the first memory cell is read and a malfunction of the sense amplifier is checked based on the presence of a read data error.

In order to restore the intermediate potential in the first memory cell, a first word line of the first memory cell is selected, and the sense amplifier is activated, and then in a state where the first bit line of the first memory cell is disconnected from the sense amplifier, a second word line of the second memory cell, which is on the first bit line and stores data opposite of the data of the first memory cell, is multiple-selected, potential of the first bit line is set to intermediate potential, after that the first word line is returned to a non-selected state, and the intermediate potential is written in the first memory cell. By this, the first memory cell virtually stores the charge quantity in the case when the capacitance of the capacitor is small. Then the first word line is selected, the sense amplifier is activated, the data in the first memory cell is read, and the presence of a read data error is checked, thereby a sense amplifier having an unbalanced characteristic can be detected.

According to the first aspect, only if a function for multiple-selecting the word lines and a function to disconnect the bit lines from the sense amplifier are available, it is unnecessary to generate a word line potential that is different from normal operation, and an accurate intermediate potential can be generated with certainty, and a sense amplifier having an unbalanced characteristic can be detected.

In the first aspect, it is preferable that a specific data pattern for applying cross-talk (coupling noise), which inverts a potential level, to a first bit line pair of the test target sense amplifier is written in a second memory cell which belongs to a second bit line pair adjacent to the first bit line pair and the first word line, and written in a fourth memory cell which belongs to a fourth bit line pair connected to a sense amplifier adjacent to the test target sense amplifier and the first word line, then the intermediate potential is restore in the first memory cell, and then the data in the first memory cell is read for checking whether there is a read data error.

The specific data pattern may be written not only to the second bit line pair adjacent to the first bit line pair, but also to a third memory cell which belongs to a third bit line pair adjacent to the opposite side the second bit line pair.

By storing a specific data pattern in the second to fourth memory cells adjacent to the first memory cell, cross talk, to invert the potential level, can be applied to the first bit line pair, and a sense amplifier which malfunctions under the worst conditions can be detected.

In the first aspect, it is preferable that in a memory structure where redundant word lines and redundant bit line pairs are provided, and when a single bit fails, the word line is replaced with a redundant word line, and when a plurality of bits fail, the bit line is replaced with a redundant bit line, after checking whether there is a read data error in the first memory cell, an operation, of receiving a command for selecting a word line which is different from the first word line, and reading the data of the first memory cell while maintaining the first word line select status regardless the command, is repeated.

According to this method of preferred mode, the presence of a plurality of failure cells in the first bit line can be notified to the test device that detects a malfunction based on the read data by issuing a command corresponding to the test, and the first bit line pair can be replaced with the redundant bit line pair, so that the sense amplifier connected to the first bit line can be replaced. If only a single failure cell is present in the first bit line, the first word line could be replaced with a redundant word line, and in this case the failure sense amplifier cannot be rejected, so this possibility must be eliminated.

In the first aspect, it is preferable that in a memory structure where redundant word lines and redundant bit line pairs are provided, and when a single bit fails, the word line is replaced with a redundant word line, and when a plurality of bits fail, the bit line is replaced with a redundant bit line, the memory device has a read data register for storing the read data of the first memory cell, and receives a command to select a word line which is different from the first word line from the test device, and outputs the stored read data in the first memory cell from the read data register.

According to this preferred embodiment as well, a plurality of failures can be generated in a bit line pair connected to a sense amplifier of which an operation failure was detected, and the test device can execute column redundancy.

In the first aspect, it is preferable that in a shared sense amplifier type memory of which two bit line pairs are connected to a common sense amplifier, if a read data error in the first memory cell is detected, the error detection result for the first memory cell is regarded as the test result in the read operation test to the memory cell of the fifth bit line pair at the opposite side of the first bit line pair connected to the test target sense amplifier. In other word, in the read operation test for the fifth bit line pair at the opposite side of the first bit line pair, the error detection result of the first memory cell can be provided to the test device using a method of continuing selection of the first word line regardless the receiving of a different word line select command, or a method of outputting data in the first memory cell from the read data register regardless the receiving of a different word line select command, according to the above mentioned preferred modes.

According to the method of this preferred mode, in the case when two bit line pairs share a sense amplifier, if a failure is detected in one bit line pair connected to the test target sense amplifier, a test result, that a failure also exists in the bit line pair at the opposite side, is provided to the test device, so that the bit line pairs on both sides of the test target sense amplifier can be replaced with the redundant bit line pairs. As a result, the sense amplifier which caused the operation failure can no longer be used.

To achieve the above object, a second aspect of the present invention provides a semiconductor memory device, having: a memory cell array which has a plurality-of-word lines, a plurality of bit line pairs, a plurality of memory cells placed at crossing positions of the word lines and bit lines, and a plurality of sense amplifiers connected to the bit line pairs for amplifying a potential difference of the bit line pair; a bit line transfer control circuit which controls a bit line transfer gate which connects the bit line pair to the corresponding sense amplifier; and a word line select circuit which selects the word line, wherein in a test mode, the word line select circuit selects a first word line corresponding to a first memory cell of a first bit line connected to a test target sense amplifier, the sense amplifier is activated and the first bit line is amplified to a first or second potential, then in a state where the bit line transfer control circuit disconnects the first bit line from the sense amplifier, the word line select circuit multiple-selects the second word line of a second memory cell which is on the first bit line and in which data opposite to the first memory cell is stored, so as to set the potential of the first bit line to an intermediate potential, and returns the first word line to a non-select state, to write the intermediate potential in the first memory cell, then the data in the first memory cell is read after precharge is performed.

In order to achieve the above object, a third aspect of the present invention provides a semiconductor memory device, having: a memory cell array which has a plurality of word lines, a plurality of bit line pairs, a plurality of memory cells placed at crossing positions of the word lines and bit lines, and a plurality of sense amplifiers connected to the bit line pairs for amplifying a potential difference of the bit line pair, wherein in a test mode, a specific data pattern for supplying a cross-talk, which inverts a potential level, to a first bit line pair connected to the test target sense amplifier, is written in second and third memory cells which belong to second and third bit line pairs adjacent to the first bit line pair and the first word line, and written in a fourth memory cell which belongs to a fourth-bit line pair connected to a sense amplifier adjacent to the test target sense amplifier and the first word line, then the intermediate potential of a first or second potential amplified by the sense amplifier is restored in the first memory cell, and then the data in the first memory cell is read for checking whether there is a read data error.

According to the present invention, the presence of a sense amplifier having an unbalanced characteristic can be detected, and a bit line pair connected to the detected sense amplifier can be replaced with a redundant bit line pair, so yield can be improved.

DETAILED DESCRIPTION OF PREFERRED EMBODIMENTS

Embodiments of the present invention will now be described with reference to the drawings. The technical scope of the present invention, however, is not limited to these embodiments, but includes the matters stated in the claims and equivalents thereof.

Figure 1:
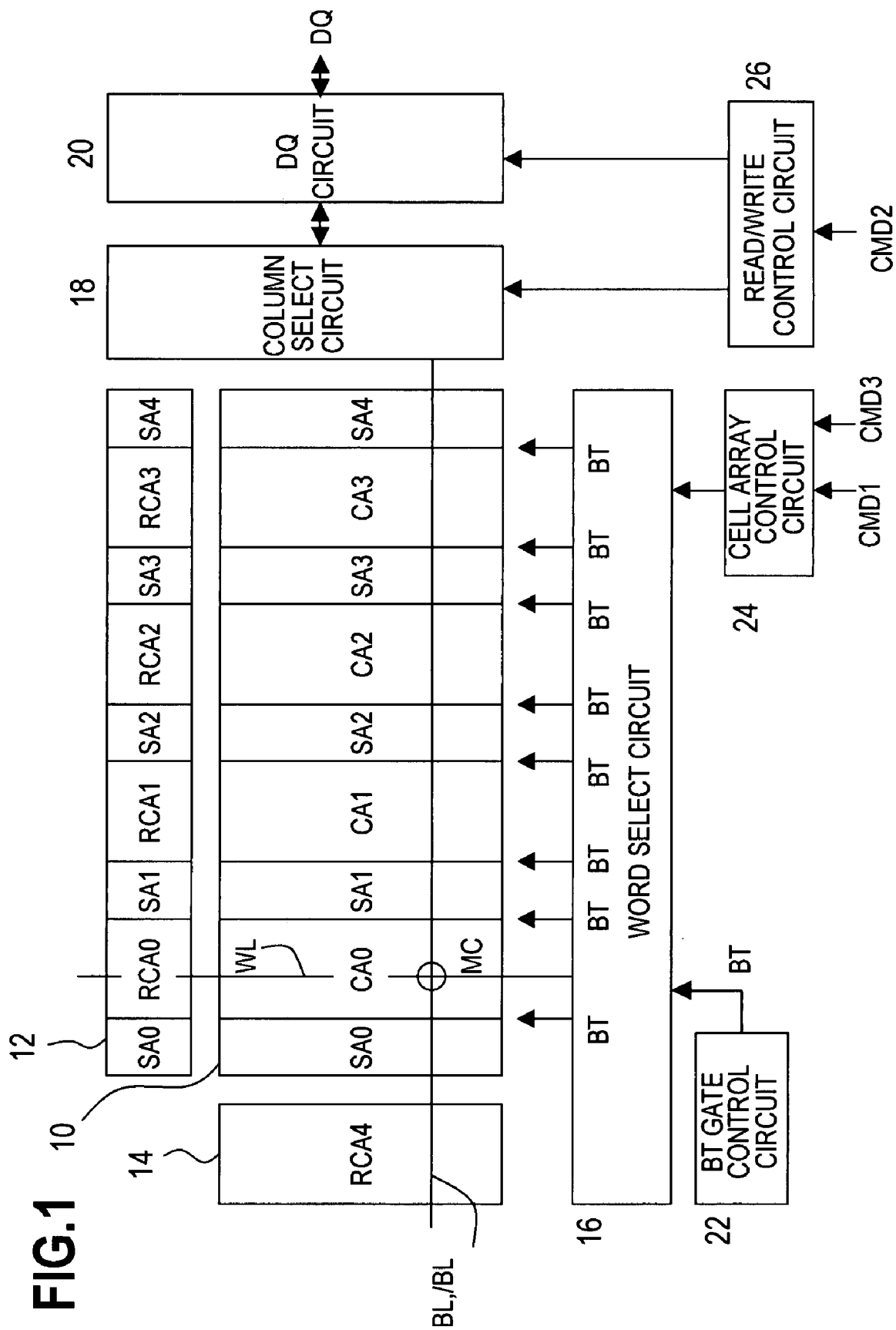
FIG. 1 is a block diagram depicting a dynamic type semiconductor memory device according to the present embodiment.

FIG. 1 is a block diagram depicting a dynamic type semiconductor memory device according to the present embodiment. A memory area 10 is normally comprised of a plurality of word lines WL, a plurality of bit line pairs BL and /BL, cell arrays CA0-CA3 having a plurality of memory cells MC placed in crossing sections thereof, and sense amplifier arrays SA0-SA4 connected to the bit line pairs. The sense amplifier arrays SA0-SA4 are placed on both sides of each cell array CA0-CA3, and are shared by the bit line pairs of the cell arrays on both sides.

In addition to the memory cell 10, a redundant column area 12 which has a redundant bit line pair for replacing a failure bit line pair, and a redundant word area 14 which has a redundant word line for replacing a failure word line, are formed, so as to relieve failure bits.

A word line select circuit 16 selects one word line from a plurality of word lines WL, and controls connection and disconnection of a bit line pair corresponding to the selected word line and a sense amplifier by using a bit line transfer signal BT. A potential of the bit line transfer signal BT is generated by a bit line transfer gate control circuit 22, and is controlled to a potential corresponding to the read operation, write operation and test mode respectively.

A column select circuit 18 selects one bit line pair from the plurality of bit line pairs, and the output of a sense amplifier connected to the selected bit line pair is output via an input/output circuit 20. Also an input data is supplied to the selected bit line pair via the input/output circuit 20.

According to the operation of the semiconductor memory device in FIG. 1, in the precharge state, a cell array control circuit 24 has the word line select circuit 16 select a new word line responding to a first command CMD1. When the word line WL is driven to a selected potential, the potential of a bit line at the memory cell side out of the bit line pair is slightly changed by the charge stored in the memory cell MC. In this state, the bit line transfer gate turns ON, and the bit line pair and the sense amplifier are connected. And the sense amplifier is activated, the potential difference of the bit line pair is amplified and the bit line pair is driven to H level and L level. This first command CMD1 corresponds to an active command in the case of an SDRAM.

Then responding to a second command CMD2, the column select circuit 18 selects a bit line pair, and the output of a corresponding sense amplifier is output to the input/output circuit 20. And the input/output circuit 20 outputs a data signal, which is output at a predetermined timing, from an input/output terminal DQ. Or a data signal which is input to the input/output terminal DQ is guided to a sense amplifier of a selected bit line pair. This second command CMD2 corresponds to the read/write command in the case of an SDRAM.

Finally, responding to a third command CMD3, the word lines are set to non-select state, and the bit lines and the sense amplifiers are precharged. The third command CMD3 corresponds to the precharge command.

In the case of a pseudo-SRAM, when one external input command is received, three commands, CMD1, CMD2 and CMD3 are automatically generated inside in a time series.

Figure 2:
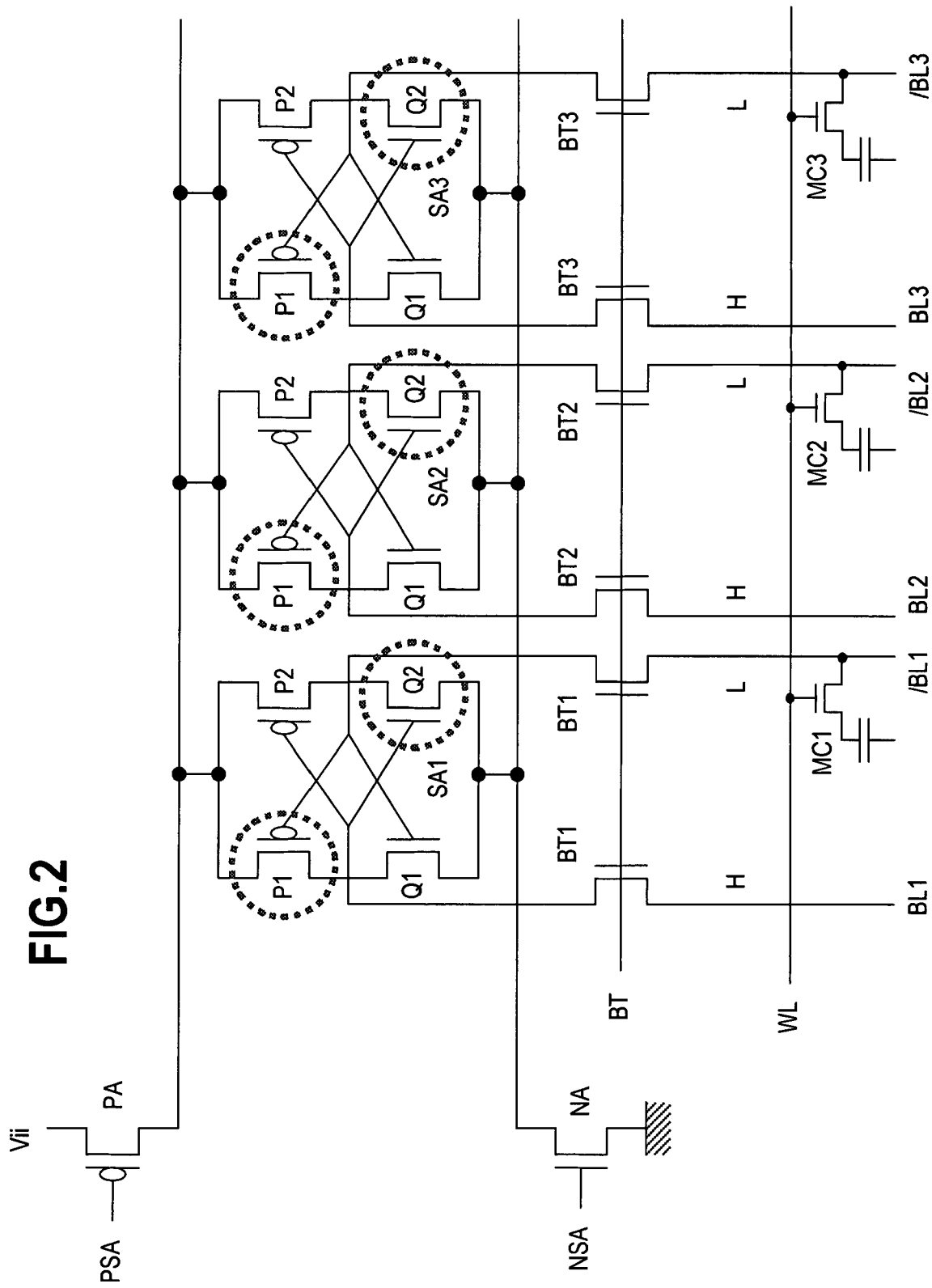
FIG. 2 is a detailed circuit diagram of the semiconductor memory device according to the present embodiment.

FIG. 2 is a detailed circuit diagram of the semiconductor memory device according to the present embodiment. FIG. 2 shows three bit line pairs, BL1 and /BL1 to BL3 and /BL3, and corresponding three sense amplifiers SA1 to SA3. The bit line pairs and the sense amplifiers are connected via the bit line transfer gates BT1 to BT3. And memory cells MC1 to MC3, each of which is comprised of a transistor and capacitor, are positioned at one of the two crossing positions of the bit line pair and the word line WL respectively.

The sense amplifier SA1 is a latch circuit where a first CMOS inverter comprised of a P-channel transistor P1 and an N-channel transistor Q1, and a second CMOS inverter comprised of transistors P2 and Q2 are cross-connected via input/output terminals. The other sense amplifiers have the same configuration. A common node of the P-channel transistors P1 and P2 is connected to a cell power supply Vii via a sense amplifier activation transistor PA, and a common node of the N-channel transistors Q1 and Q2 is connected to a ground power supply via a sense amplifier activation transistor QA, and when a sense amplifier activation signal PSA (L level) or NSA (H level) is applied to the gates of these sense amplifier activation transistors, the sense amplifiers are activated.

When the word line WL is selected and driven to H level while the bit line pairs BL1 and /BL1 to BL3 and /BL3 are precharged to precharge level Vii/2, the bit lines /BL1, /BL2 and /BL3 are all slightly dropped by the memory cells MC1, MC2 and MC3 which are storing L level. The potential of these bit lines are set to the sense amplifiers SA1, SA2 and SA3 via the bit line transfer gates BT1, BT2 and BT3, which are in ON state. If the sense activation signals PSA and NSA are driven in this state, each sense amplifier amplifies the potential difference of the bit line pair, and drives both bit lines to the power supply Vii level and ground level.

As the circuit diagram in FIG. 2 shows, out of the adjacent bit line pairs BL1, /BL1, BL2 and /BL2, the bit lines /BL1 and BL2 are placed adjacent to each other, and give a coupling noise due to the parasitic capacitance to each other. For example, if the bit line BL2 is driven to the H side by driving the sense amplifier SA2, noise by this is transferred to the bit line /BL1, and the potential of the bit line /BL1 increases. Therefore if the drive operation of the sense amplifier SA1 delays due to an unbalanced characteristic, the potential difference between the bit line pair BL1 and /BL1 decreases, and becomes a cause of a malfunction of the sense amplifier SA1.

The adjacent sense amplifiers SA1 and SA2 also generate a coupling noise due to the parasitic capacitance to each other. So for the same reason as above, this becomes a cause of a malfunction of the sense amplifiers.

Figure 3:
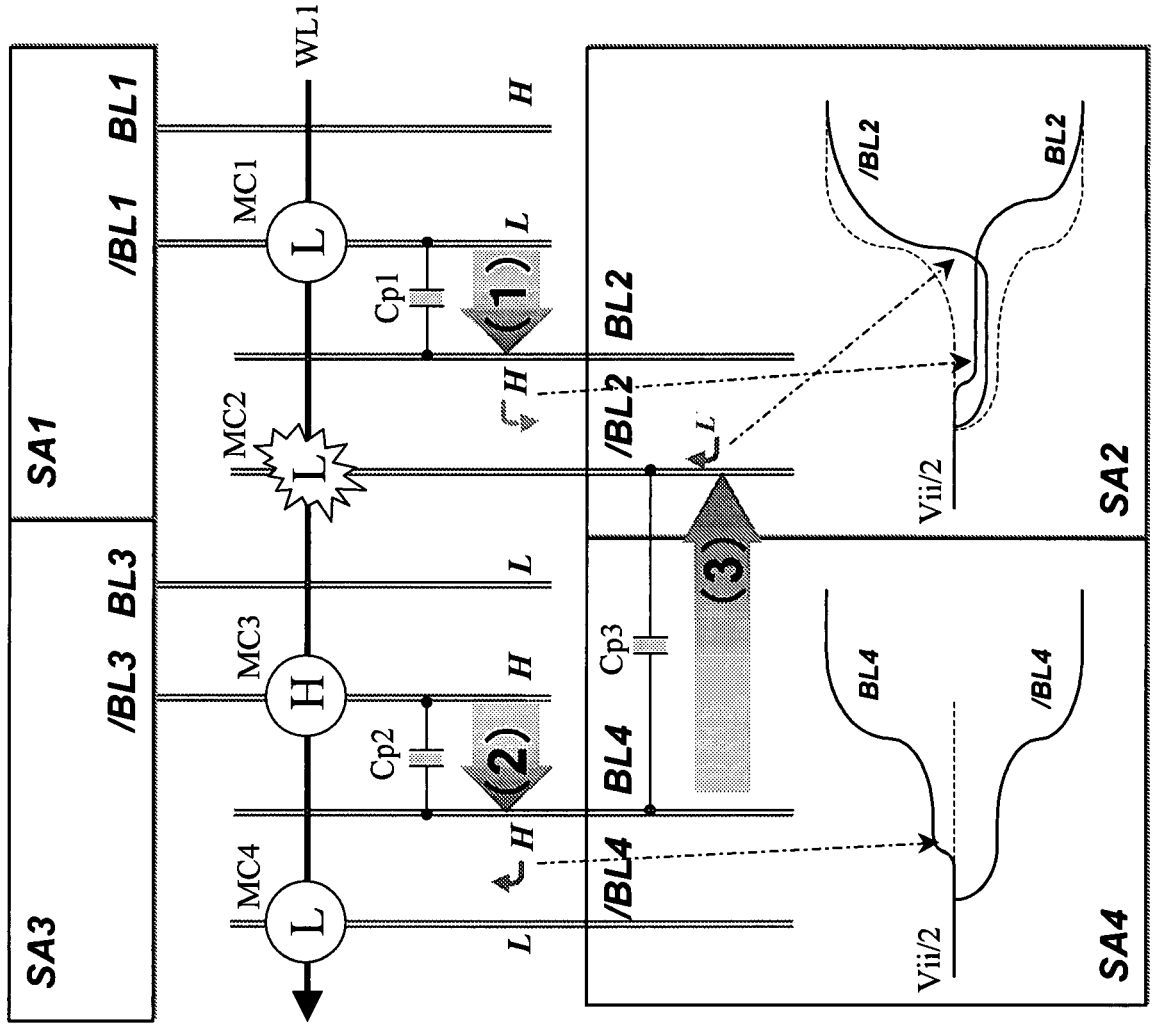
FIG. 3 is a diagram depicting a test pattern according to the present embodiment.
Figure 4:
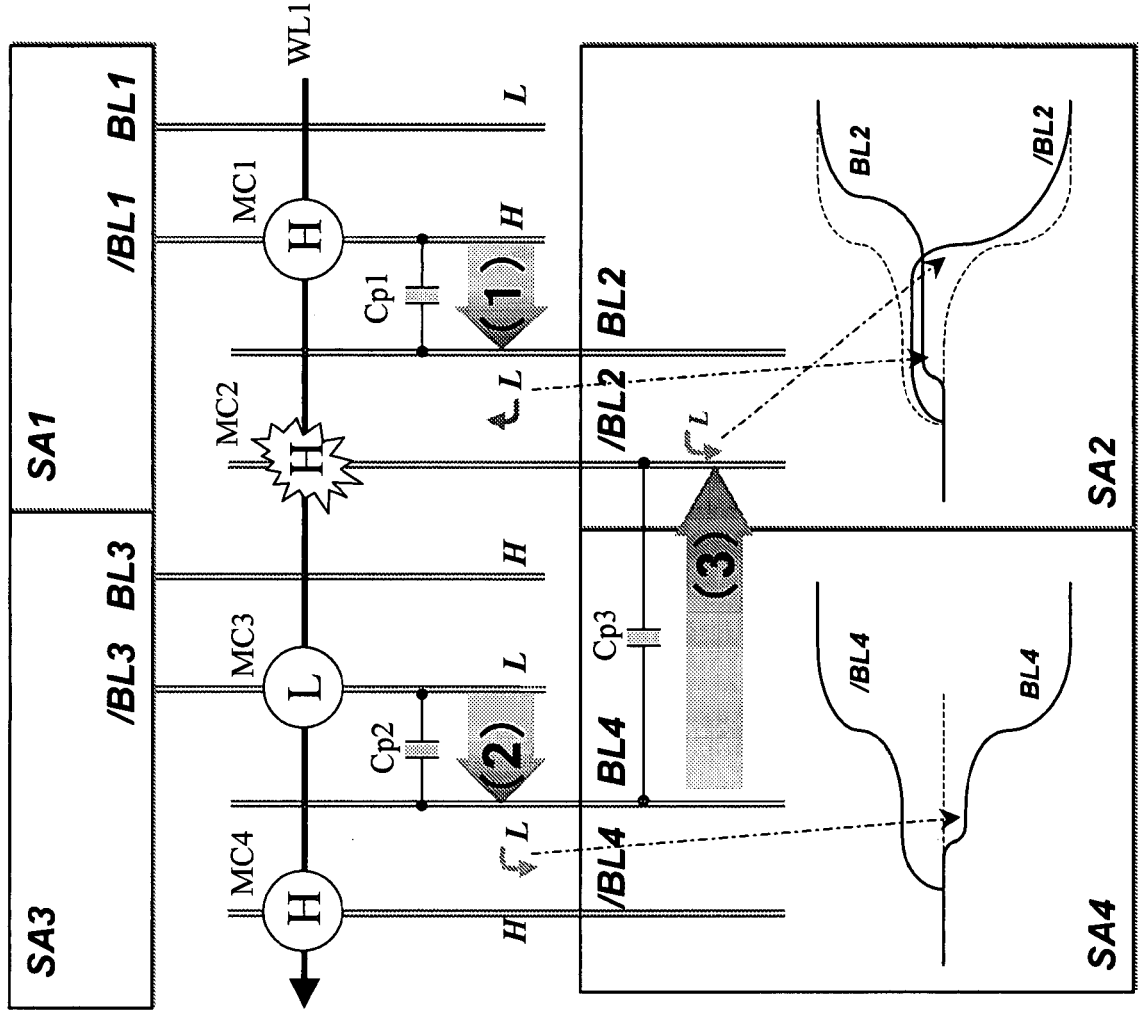
FIG. 4 is a diagram depicting a test pattern according to the present embodiment.

FIG. 3 and FIG. 4 are diagrams depicting the test patterns according to the present embodiment. FIG. 3 and FIG. 4 shows four bit line pairs BL1 and /BL1 to BL4 and /BL4, a word line WL1, memory cells MC1 to MC4 at crossing position thereof, sense amplifiers SA1 and SA3 connected to an odd bit line pair, and sense amplifiers SA2 and SA4 connected to an even bit line pair. In the sense amplifiers SA2 and SA4, voltage waveforms of the corresponding bit pair are shown. In both FIG. 3 and FIG. 4, the sense amplifier SA2 is a test target sense amplifier, for which an error of read data, when the memory cell MC2 is read, is checked.

In FIG. 3, data L, L, H and L are stored in the memory cells MC1 to MC4 as a specific test pattern which induces a malfunction of the sense amplifier SA2. First when the word line WL1 is driven to a selected potential, a micro-potential difference is generated in the bit line pair corresponding to the data of each memory cell. The potential of a bit line connected to the memory cell changes, and the potential of an unconnected bit line, which does not change, functions as a reference potential.

And when the sense amplifiers SA1 to SA4 on both sides are activated, (1) the bit line /BL1 is driven to L level by the sense amplifier SA1, and noise is applied to the adjacent bit line BL2 which has a reference potential via the parasitic capacitance Cp1, and the reference level thereof drops (see the waveform BL2 of the sense amplifier SA2). Also (2) the bit line /BL3 is driven to H level by the sense amplifier SA3, then noise is applied to the adjacent bit line BL4 which has a reference potential via the parasitic capacitance Cp2, and the reference level BL4 increases. And (3) noise is applied to the node at the bit line /BL2 side of the adjacent sense amplifier SA2 from the sense amplifier SA4 via the parasitic capacitance Cp3, and the potential of the bit line /BL2, which is supposed to be L level, increases.

When the coupling noise from the adjacent bit line and adjacent sense amplifier becomes a worst pattern, as described above, the bit line BL2 out of the bit line pair of the target memory cell MC2 is pulled down to L level, and the bit line /BL2 is pulled up to H level. And if the sense amplifier SA2 has an unbalanced characteristic, the bit line pairs BL2 and /BL2 are driven to opposite directions, and opposite data is read. In this case, if the capacitance of the cell capacitor of the memory cell MC2 is small, the probability of this malfunction increases.

In FIG. 4, data H, H, L and H are stored in the memory cells MC1 to MC4 as a specific test pattern which induces a malfunction of the sense amplifier SA2. In this test pattern as well, just like the case of FIG. 3, a malfunction of the sense amplifier SA2 is generated because of the coupling noise due to the parasitic capacitance between adjacent bit lines and the parasitic capacitance between adjacent sense amplifiers.

In other words, when the sense amplifiers SA1 to SA4 are activated after the word line WL1 is driven to the selected potential, (1) the bit line /BL1 is driven to H level by the sense amplifier SA1, and noise is applied to the bit line BL2 via the parasitic capacitance Cp1, and the potential of the bit-line BL2 rises. Also (2) the bit line /BL3 is driven to L level by the sense amplifier SA3, noise is applied to the bit line BL4 via the parasitic capacitance Cp2, and the potential thereof drops. And (3), the bit line BL4 is driven to the L level by a fast operation of the sense amplifier SA4, and noise is applied to a node of the bit line /BL2 of the adjacent sense amplifier SA2 via the parasitic capacitance Cp3. As a result, the levels of the bit line pair /BL2 and BL2 are inverted by the sense amplifier SA2, and reversed data is read. In this case as well, the probability of a malfunction increases if the capacitance of the cell capacitor of the memory cell MC2 is small.

According to the test method of the present embodiment, a sense amplifier having an unbalanced characteristic is detected, so data in the target memory cell MC2 is read in a state where a specific test pattern, which is strongly interfered with by the above mentioned adjacent bit line and sense amplifier, is written, and it is checked whether a data error is read.

Also when a capacitance of the cell capacitor of the memory cell MC2 is small, a malfunction may occur due to an unbalanced characteristic of the sense amplifier.

Therefore in addition to writing the above mentioned specific test pattern, an intermediate potential, which is closer to the precharge level (Vii/2) than the normal drive levels (Vii and ground) of the sense amplifier, is written to the target memory cell MC2. By writing the intermediate potential, the case when the capacitance of the cell capacitor is small can be reproduced. In other words, by writing the intermediate potential, when the target memory cell is read, the change quantity of the potential of the bit line when the word line WL1 is selected can be decreased. This phenomena is the same as the case when normal levels (Vii and ground) are written to a cell capacitor of which capacitance is small.

Figure 5:
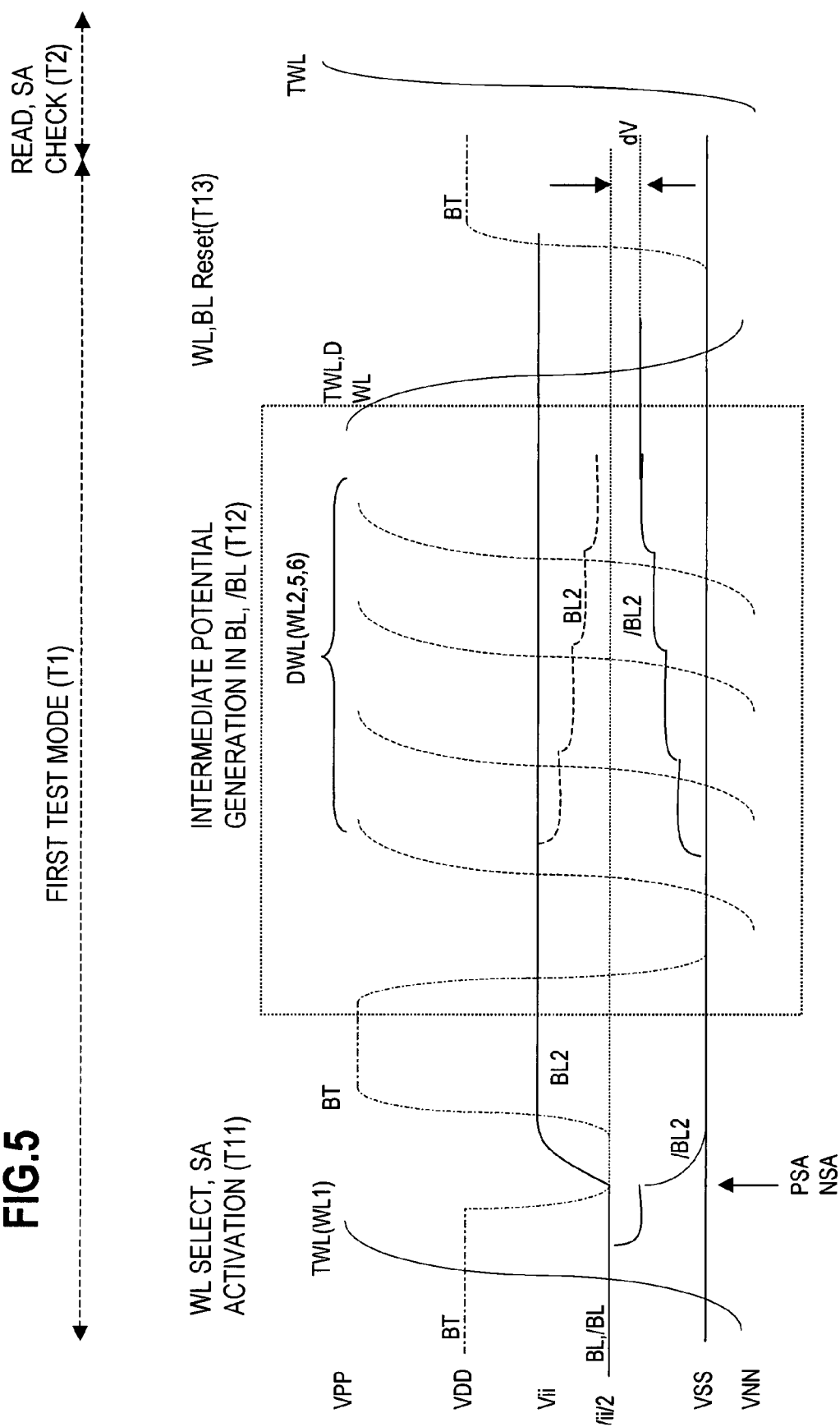
FIG. 5 is a waveform diagram depicting a method of restoring intermediate potential in a memory cell according to the present embodiment.
Figure 6:
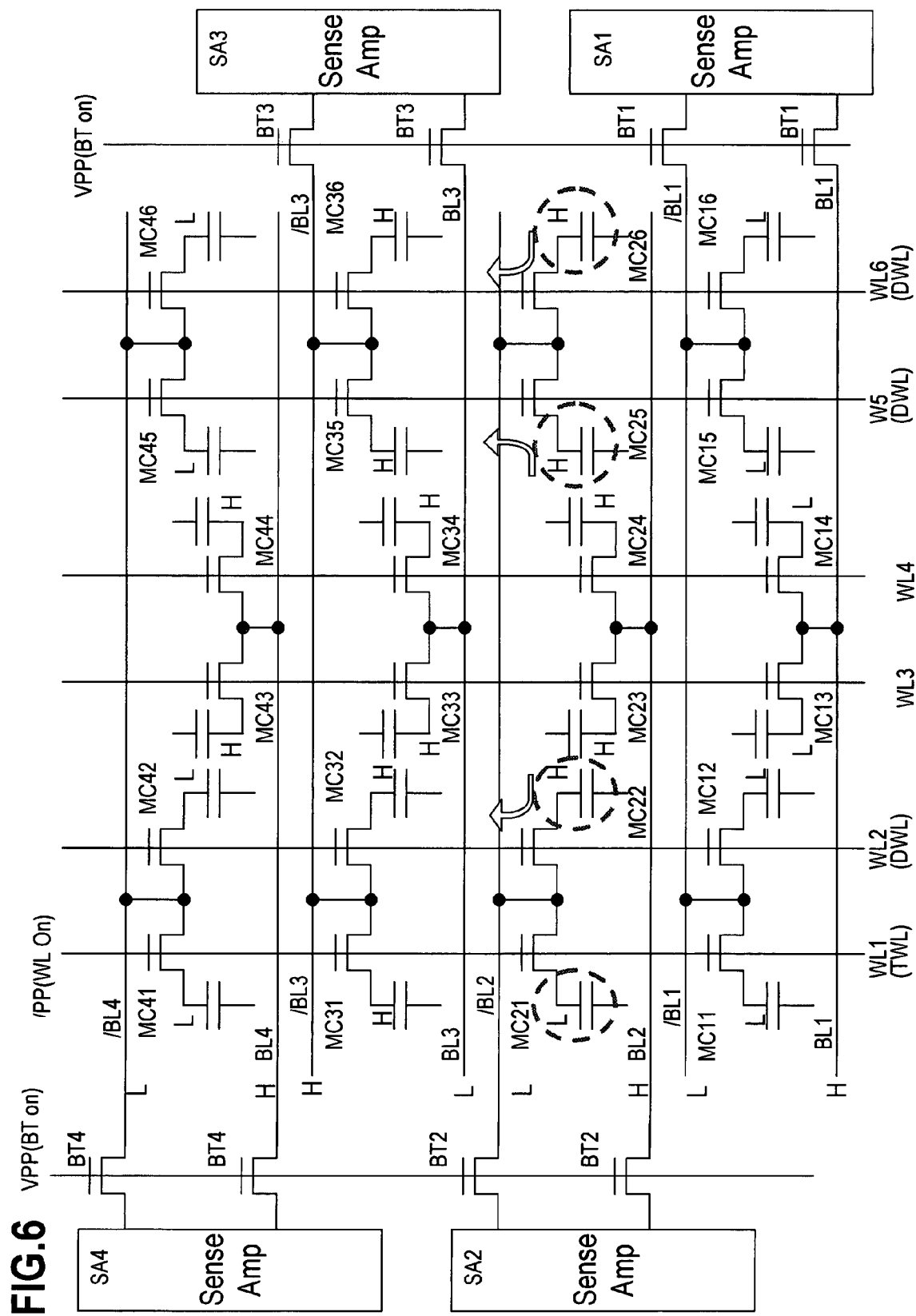
FIG. 6 is a diagram depicting data and a memory circuit of each memory cell when intermediate potential is restored in the memory cell according to the present embodiment.
Figure 7:
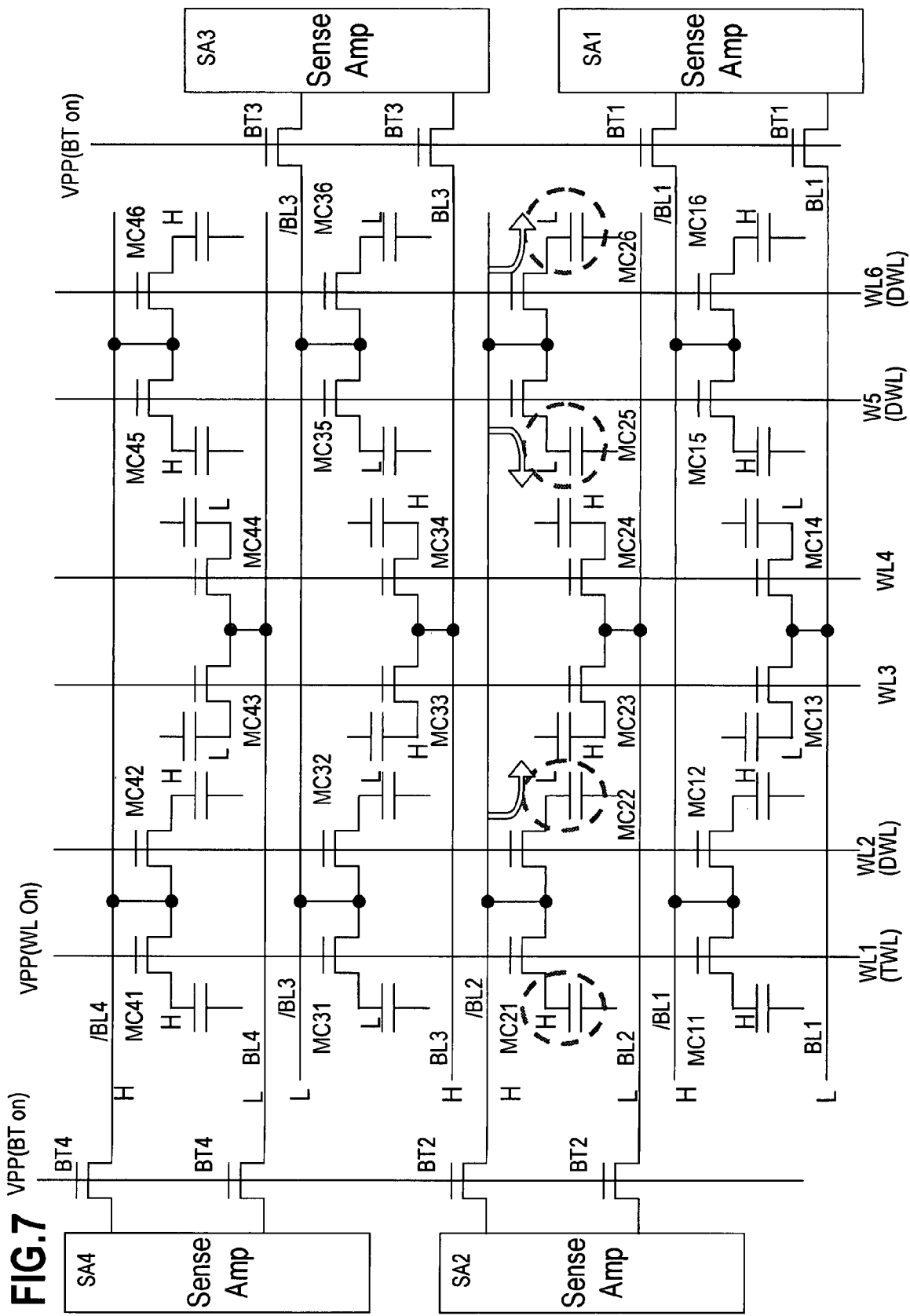
FIG. 7 is a diagram depicting data and a memory circuit of each memory cell when intermediate potential is restored in the memory cell according to the present embodiment.

FIG. 5 is a waveform diagram depicting a method of restoring the intermediate potential in a memory cell according to the present embodiment. FIG. 6 and FIG. 7 are diagrams depicting the data of each memory cell and the memory circuit when the intermediate potential is restored in the memory cell according to the present embodiment. The specific test patterns in FIG. 6 and FIG. 7 correspond to the above mentioned FIG. 3 and FIG. 4. Also the intermediate potential of the bit line /BL2 in FIG. 5 corresponds to FIG. 3 and FIG. 6, and the intermediate potential of the bit line BL2 corresponds to FIG. 4 and FIG. 7.

In FIG. 6, the four memory cells MC11, MC21, MC31 and MC41 are connected to the target word line WL1, the memory cell MC21 is the target memory cell, and the sense amplifier SA2 is the test target sense amplifier. In these four memory cells, MC11-41 data L, L, H and L are written just like FIG. 3. In the memory cells MC22, MC25 and MC26, which are connected to the same bit line /BL2 as the target memory cell MC21, on the other hand, data (H level) opposite from that of the target memory cell MC21 is written. In the memory cells MC12, MC15, MC16, MC32, MC35, MC36, MC42, MC45 and MC46, which are connected to the same bit line as the memory cells MC11, MC31 and MC41, which are not targets, data the same as that of memory cells MC11, MC31 and MC41 is stored.

Hereafter the word line WL1 of the target memory cell MC21 is called the "target word line TWL". The word lines WL2, WL5 and WL6 of the memory cells MC22, MC25 and MC26, connected to the same bit line /BL2 as the target memory cell MC21, are called the "disturb word lines DWL".

Now a method for restoring (writing) an intermediate potential in the target memory cell MC21 will be described with reference to FIG. 5. In FIG. 5, the five power supplies are the external power supply VDD, ground power supply VSS, boosting power supply VPP, cell power supply Vii and non-select potential power supply VNN (negative voltage) of a word line. In FIG. 5, the intermediate potential is restored in the memory cell MC21 in the first test mode period T1, and the memory cell MC21 is read in the subsequent read period T2.

The case when the specific test pattern in FIG. 6 is written will be described. After the specific pattern is written, the target word line TWL is driven to the boosting power supply VPP with the selected potential while precharge state in the first test mode period T1. By this, the bit line /BL2 slightly drops from the precharge level Vii/2. At this time, the bit line transfer signal BT is at the power supply VDD level, and the bit line pair is connected to the sense amplifier, so this drop of the level of the bit line /BL2 is transferred to the sense amplifier. And the bit line transfer signal BT is dropped once to disconnect the sense amplifier from the bit line, and in this state, the sense amplifier is activated (PSA, NSA). By this, the sense amplifier amplifies the two nodes, and drives the node BL2 to H level and node /BL2 to L level. In this state, the bit line transistor signal BT is driven to the boosting power supply VPP level, so that the sense amplifier and bit line are completely connected, and the levels of the bit line pair BL2 and /BL2 are also driven to H level and L level completely. This is the operation in the period T11.

Then in the intermediate potential generation period T12, the bit line transfer signal BT is driven to ground VSS in a state where the target word line TWL is maintained at the selected potential, so that the bit line pair is disconnected from the sense amplifier. In other words, the bit line pair is set to floating state. In this state, the disturb word lines DWL (WL2, WL5 and WL6) are driven to the selected potential VPP sequentially or all at once. (In FIG. 5, four DWLs are driven, but the number of DWLs can be arbitrary.) In other words, in addition to the target word line TWL, the disturb word lines DWL are multiple-selected.

When the word line WL2 is driven, charge flows out from the memory cell MC22 where H level, which is reversed data of the target memory cell, is stored, and potential of the bit line /BL2 rises up to the level based on the capacitance division with the bit line /BL2. When the word line WL5 or WL6 is driven as well, the potential of the bit line /BL2 rises little by little by the same operation. Since the bit line pair is disconnected from the sense amplifier, the above mentioned rise to the intermediate potential is possible. If the bit line pair is connected to the sense amplifier, the bit line /BL2 is maintained at the state of ground level VSS by driving of the sense amplifier. When the sense amplifier is connected to the bit line pair, even if the sense amplifier is in inactive state, the sense amplifier in the inactive state is temporarily driven responding to the change of potential of the bit line /BL2, as shown in Patent Document 1. Therefore in order to generate an intermediate potential, it is necessary to disconnect the bit line pair from the sense amplifier, and maintain it in a floating state.

At this time, since data, the same as a memory cell other than the target memory cell connected to the target word line WL1, is written in the memory cells of the bit line pairs other than the bit line pair of the target memory cell, so even if the disturb word lines DWL are driven, the potentials of the bit line pairs, other than the target bit line pair /BL2 and BL2, do not change.

And when all the word lines TWL and DWL are pulled down to the non-select potential in the reset period T13, an intermediate potential between the precharge level Vii/2 and the ground is restored in the target memory cell MC21. In other words, the voltage dV in FIG. 5 is restored in the target memory cell MC21. In this reset period, the bit line pair and sense amplifier are precharged.

After the first test mode T1, the target word line TWL (WL1) is driven to the selected potential, and the data in the target memory cell MC21 is read. This read operation is in a state where the specific test pattern is written, and interference is received most from adjacent bit lines and sense amplifiers, and is the same as the operation in the case when the cell capacitor of the target memory cell MC21 is small. Therefore by checking whether the read data is correct or not, it can be detected whether the sense amplifier SA2 is a failure sense amplifier having an unbalanced characteristic.

When the specific test pattern in FIG. 7 is written as well, the same operation as this is performed. However, if H level has been stored in the target memory cell MC21, and the disturb word lines DWL are multiple-selected, then the H level of the bit line /BL2 sequentially drops by the L level of the memory cells MC22, MC25 and MC26, as shown in FIG. 7, and becomes an intermediate potential between the precharge potential Vii/2 and H level (Vii). This intermediate potential is restored in the target memory cell MC21.

Figure 8:
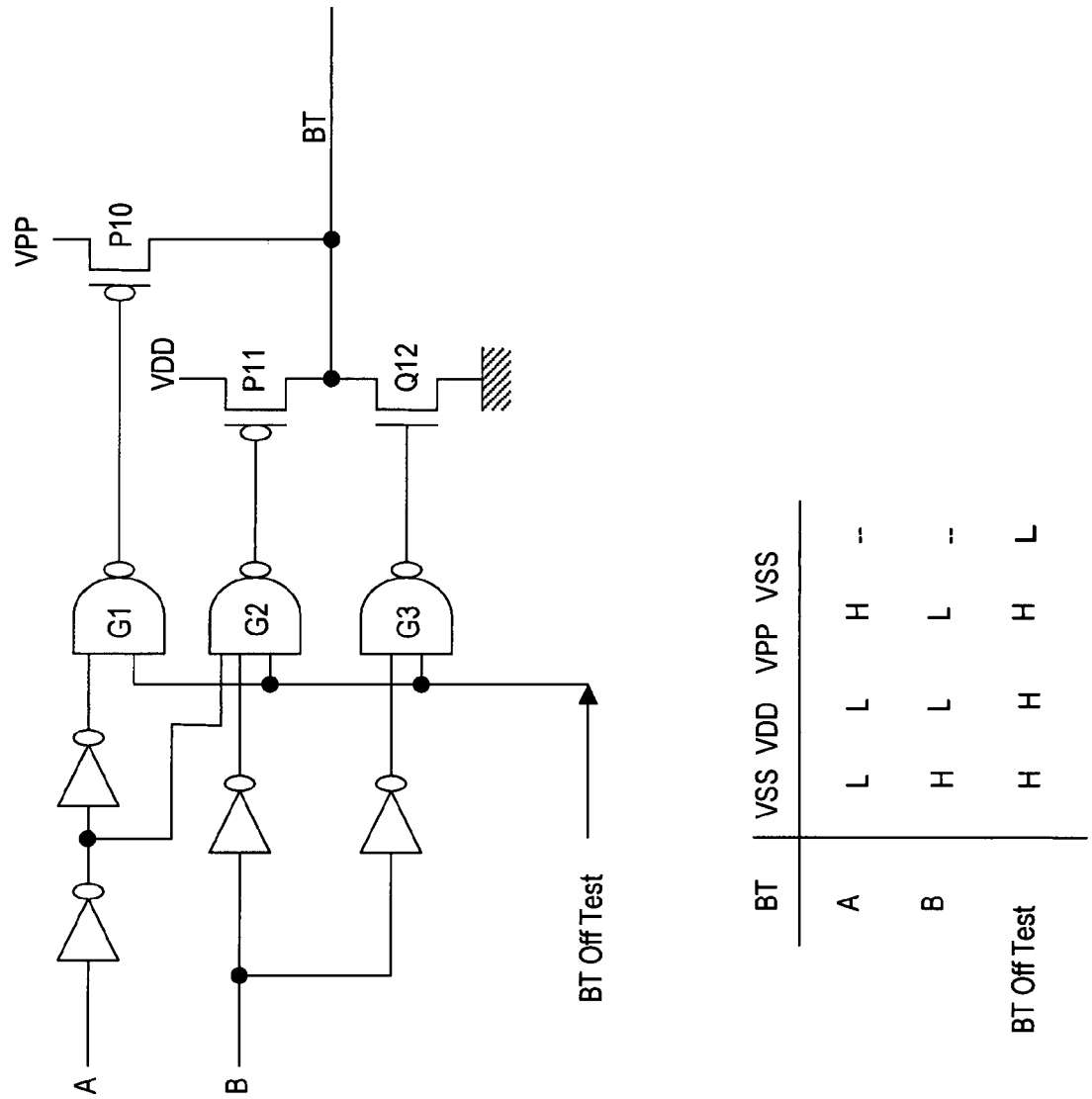
FIG. 8 shows a circuit diagram of the bit line transfer control circuit and an operation logic value table according to the present embodiment.

FIG. 8 shows a bit line transfer control circuit according to the present embodiment, and an operation logic value table. The bit line transfer control circuit 22 is comprised of P-channel transistors P10 and P11 and N-channel transistor Q12. And as the operation logic value table shows, the bit line transfer signal BT is controlled based on the combination of the control signals A and B, to be ground level VSS when the transistor Q12 is turned ON, to be power supply level VDD when the transistor P11 is turned ON, and to be boosting level VPP when the transistor P10 is turned ON respectively. In the normal read and write operation, the potential of the bit line transfer signal BT is controlled as above by the combination of the control signals A and B.

And in the present embodiment, the test signal BT Off Test is supplied to the input of the NAND gates G1, G2 and G3, and this test signal is maintained at H level in normal operation, but is set to L level in the intermediate potential generation period T12 (see FIG. 5). By this, the output of the NAND gates G1 to G3 all become H level regardless whether the control signal is A or B, and only the transistor Q12 turns ON, and the bit line transfer signal BT becomes ground level VSS. By this, a pair of bit line transfer signals BT selected by the word line select circuit 16 become ground level, and the bit line pair is disconnected from the sense amplifier and becomes floating state. The test signal BT Off Test corresponds to the first test mode command, which is described later.

Figure 9:
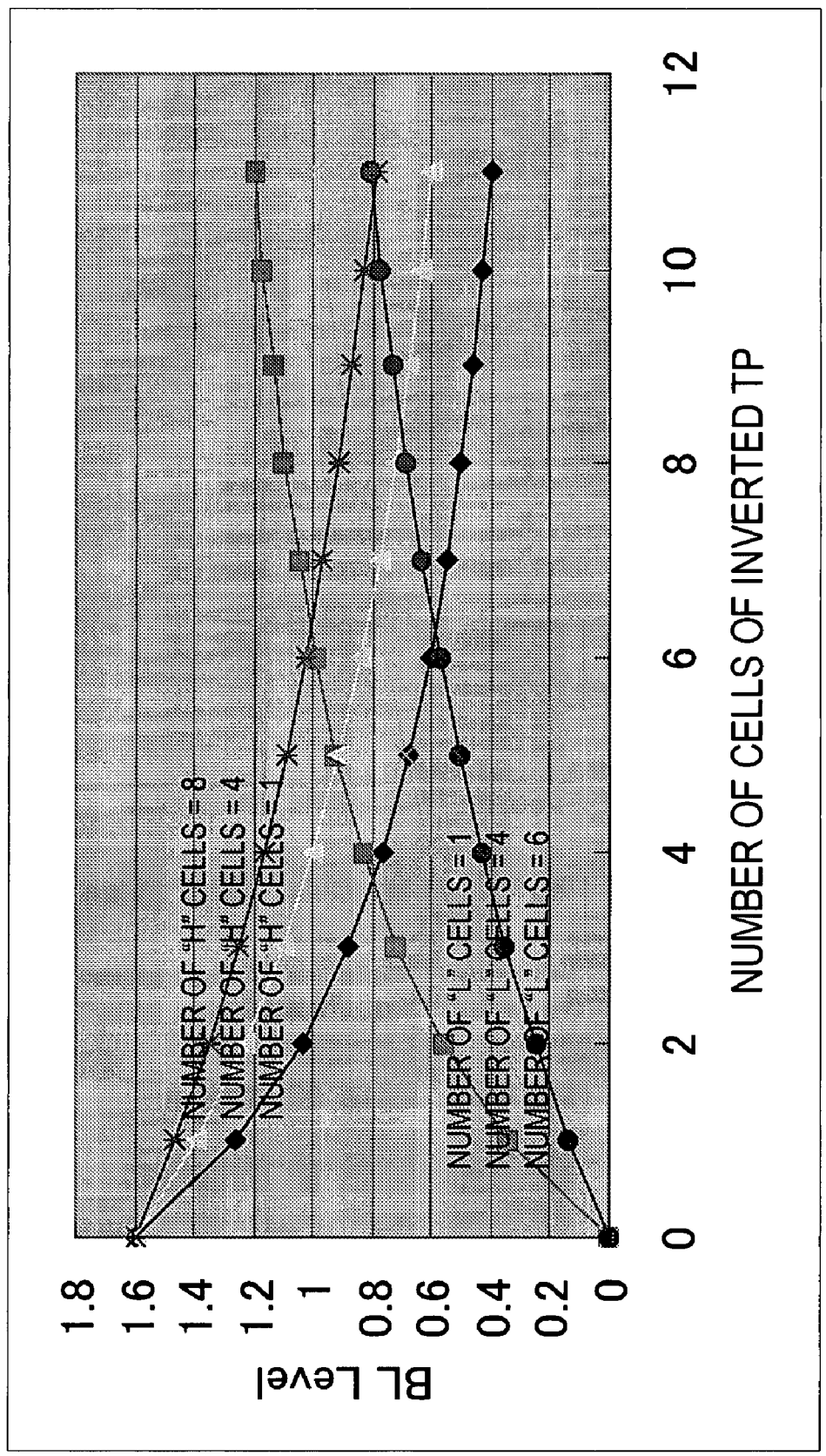
FIG. 9 is a diagram depicting the levels of intermediate potential according to the present embodiment.

FIG. 9 is a diagram depicting the level of intermediate potential according to the present embodiment. In the above description, three or four disturb side memory cells, where inverted data is written, are used for one target memory cell MC21. However, the number of memory cells is not limited to this, but any number of target memory cells and any number of disturb side memory cells can be selected, so as to generate an intermediate potential corresponding to the respective numbers. FIG. 9 shows this.

The ordinate shows a potential level generated in the bit line, and FIG. 9 shows an example when the internal cell power supply Vii is 1.6V and the precharge level Vii/2 is 0.8V. The abscissa is the number of disturb side memory cells. And the intermediate potentials to be generated are plotted when the number of target memory cells or the number of memory cells storing data the same as the target memory cell is 1, 4 and 8. By selecting a number of disturb side memory cells and a number of memory cells storing the same data as the target memory cell, the target intermediate potential (intermediate potential between the precharge level Vii/2 and Vii or ground) can be generated.

Figure 10:
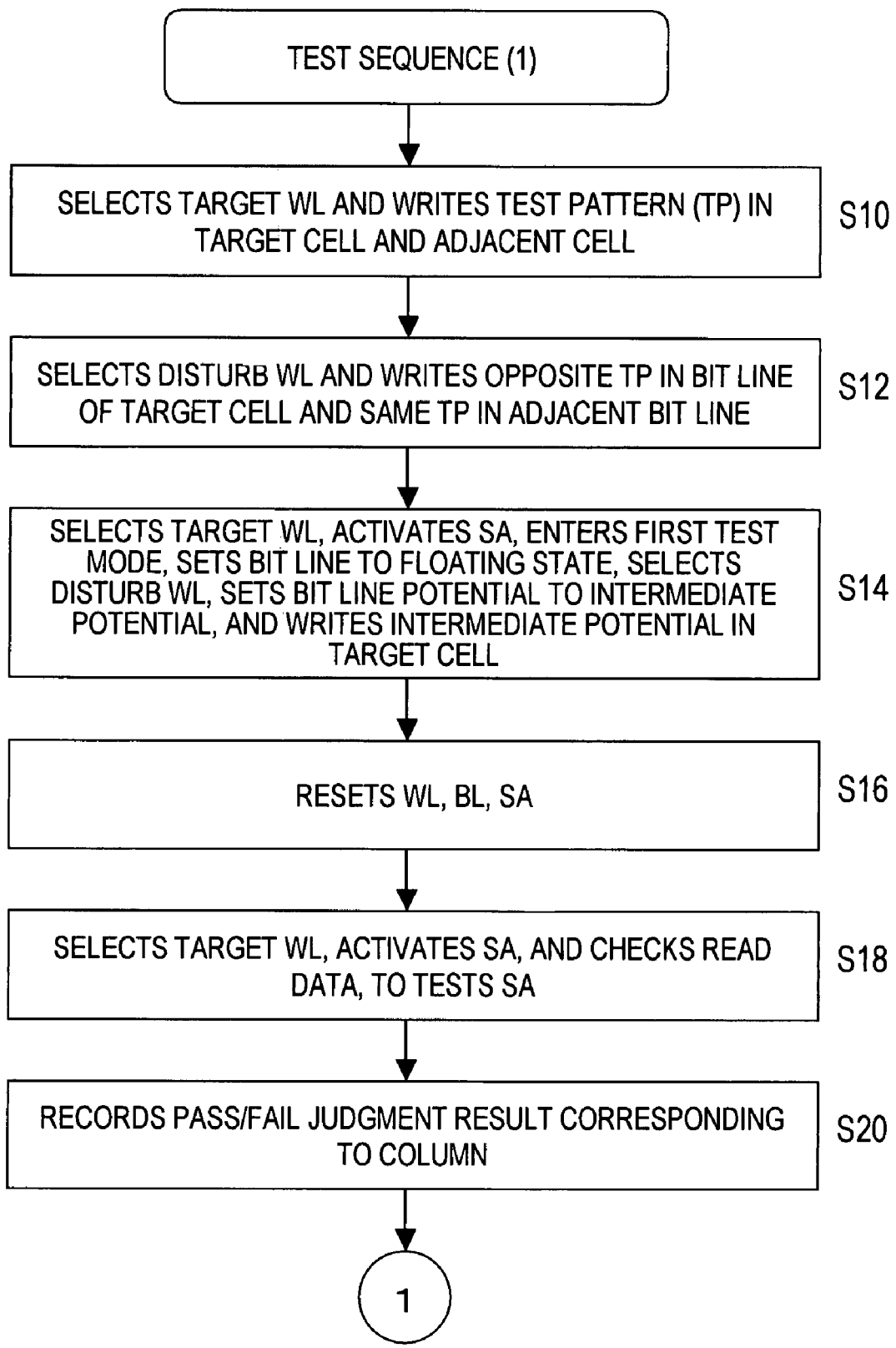
FIG. 10 is a flow chart depicting the first test sequence according to the present embodiment.
Figure 11:
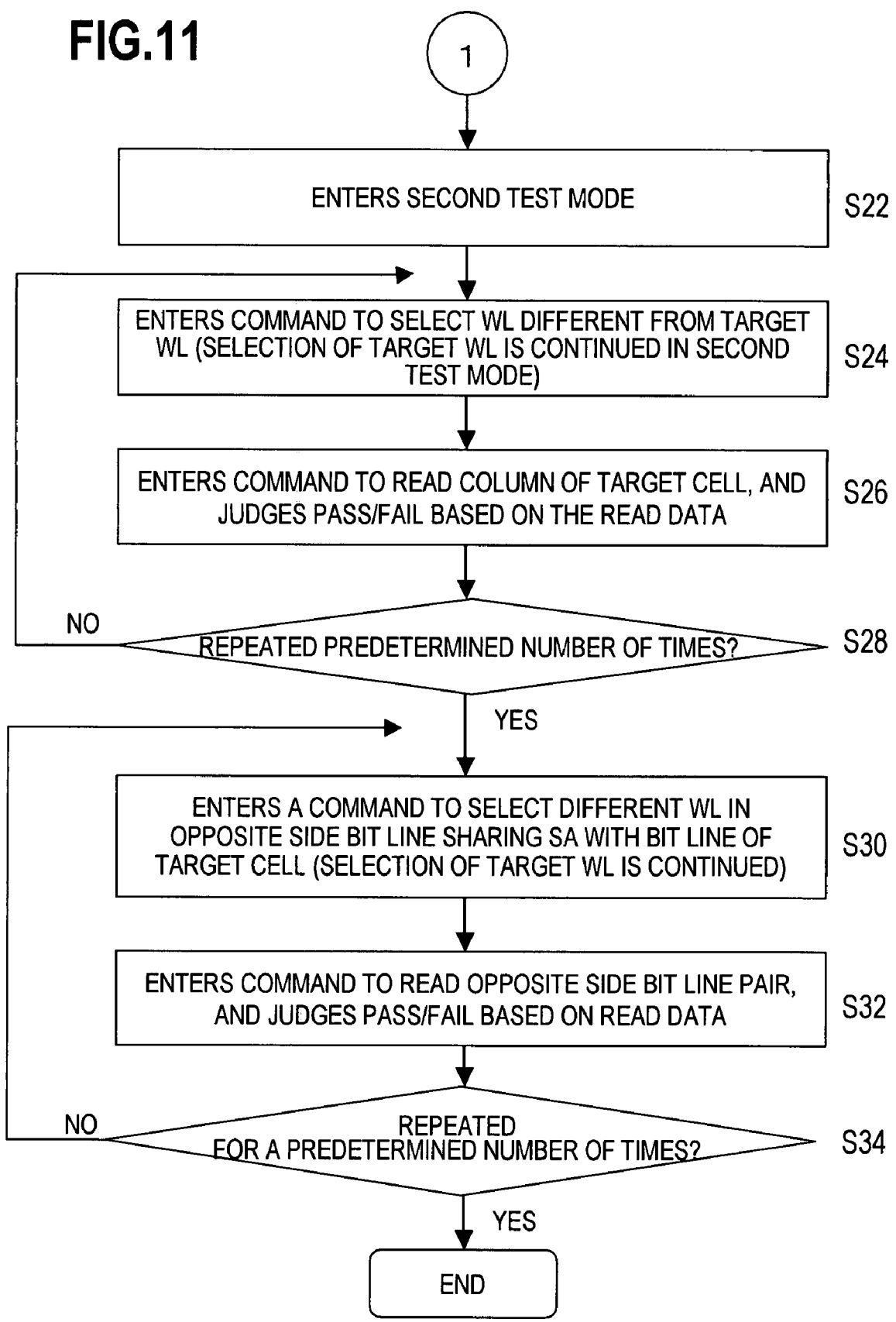
FIG. 11 is a flow chart depicting the first test sequence according to the present embodiment.

FIG. 10 and FIG. 11 are flow charts of the first test sequence according to the present embodiment. FIG. 10 and FIG. 11 shows a sequence when one sense amplifier is tested. Therefore in order to test all the sense amplifiers, the test sequence in FIG. 10 and FIG. 11 is executed in each sense amplifier while shifting four sets of bit line pairs by incrementing or decrementing a column address.

First the test target memory device is connected to the test device, the memory device performs the test operation by a control command from the test device, and the test device checks malfunctions from the read data.

First a specific test pattern is written. A target word line is selected, and data of the test pattern is written to the target cell MC21 and adjacent three cells MC11, MC31 and MC41 (S10). The test pattern is LLHL or HHLH, as mentioned above. Then a disturb side word line is selected, and inverted data of the test pattern is written in the memory cell of the bit-line the same as the target memory cell, and data the same as the test pattern is written in the memory cell of the adjacent bit line (S12).

Then as FIG. 5 shows, the target word line TWL is selected, the sense amplifier is activated, and the bit line pair is driven to the H and L levels, then the memory device enters the first test mode. In other words, the test signal BT Off Test is set to L level, and the bit line is disconnected from the sense amplifier, and is set to the floating state. In this state, the disturb side word line is multiple-selected (multiple-selected with the target word line), and the target bit line potential is set to the intermediate potential. And all the word lines are set to non-select level, and the generated intermediate potential is written to the target cell MC 21 (S14 and S16). By this, the target memory cell is virtually set to a cell with a capacitor of small capacitance.

By the above steps, the specific test pattern is written in the adjacent bit line of the target memory cell and the bit line of the sense amplifier adjacent to the target sense amplifier, and the target memory cell virtually becomes a state of a capacitor of which capacitance is small. And the target word line is selected, the sense amplifier is activated, and the data in the target memory cell is read. The test device judges whether a failure exists in the word line and the bit line depending on whether the read data is correct or not (S18). The test device records the judgment result, pass or fail, of the operation test corresponding to the column address (S19).

This test is for detecting a failure of the sense amplifier, so if one target memory cell is virtually set to a state of small capacitance and read operation is performed, failure of the sense amplifier can be checked by the read data. Therefore, by the read operation of one memory cell connected to the sense amplifier, failure of the sense amplifier can be checked.

However when a failure bit exists, column redundancy, which replaces the bit line pair with a redundant bit line pair, or word redundancy, which replaces the word line with a redundant word line, are possible. Normally word line redundancy is performed for a single failure, and column redundancy is performed for a plurality of failures. In the present embodiment, a failure of the sense amplifier must be detected and replaced with the redundant side, so column redundancy is required. Therefore in the present embodiment, the memory device is artificially operated so that once a failure is detected, a plurality of failures are detected in the same bit line.

Figure 12:
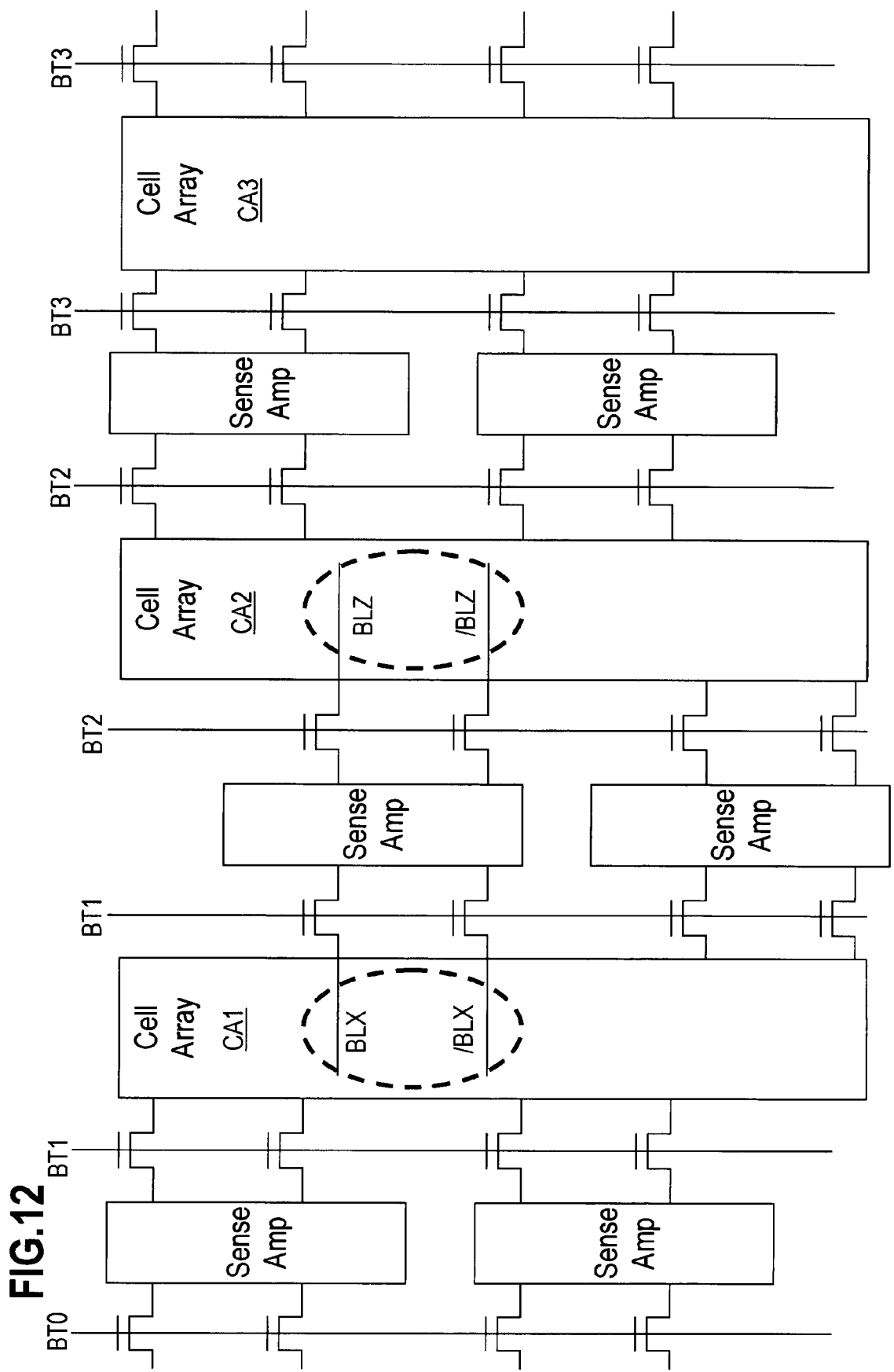
FIG. 12 is a diagram depicting the test sequence in FIG. 11.

Then in the case of a shared sense amplifier type where a common sense amplifier is shared by the bit line pairs on both sides, if a failure is detected in one of the bit line pairs, a failure is also generated in the other bit line pair, so that the sense amplifier shared by these bit line pairs is replaced with the redundancy side. Therefore in the present embodiment, once a failure is detected, the memory device is artificially operated so that a failure is also detected in the bit line pair opposite side of the sense amplifier second operation sequence. FIG. 12 describes this.

FIG. 12 is a diagram depicting the test sequence in FIG. 11. As shown in FIG. 1, the sense amplifier columns are placed on both sides of the cell array, and two bit line pairs, BLx and /BLx and BLz and /BLz, encircled by the broken line in FIG. 12, share a common sense amplifier. Therefore if a failure is detected in the read data in the bit line pair BLx and /BLx, the memory device is operated so that a failure is also detected in the bit line pair BLz and /BLz at the opposite side of the sense amplifier.

The test sequence S22 to S28 in FIG. 11 corresponds to the above mentioned first operation sequence, and S30 to S34 correspond to the second operation sequence. First the test device issues a second test mode command CMD4 and sets the memory device to the second test mode (S22). And the test device enters a command CMD3 for resetting the word line, and enters a command CMD1 for selecting a word line, which is different from the target word line (S24). And the test device enters a command CMD2 to read data of the bit-line pair of the target memory cell, reads the data of the target memory cell, and judges if an error exists (S26). These steps S24 and S26 are repeated for a predetermined number of times (S28).

Figure 13:
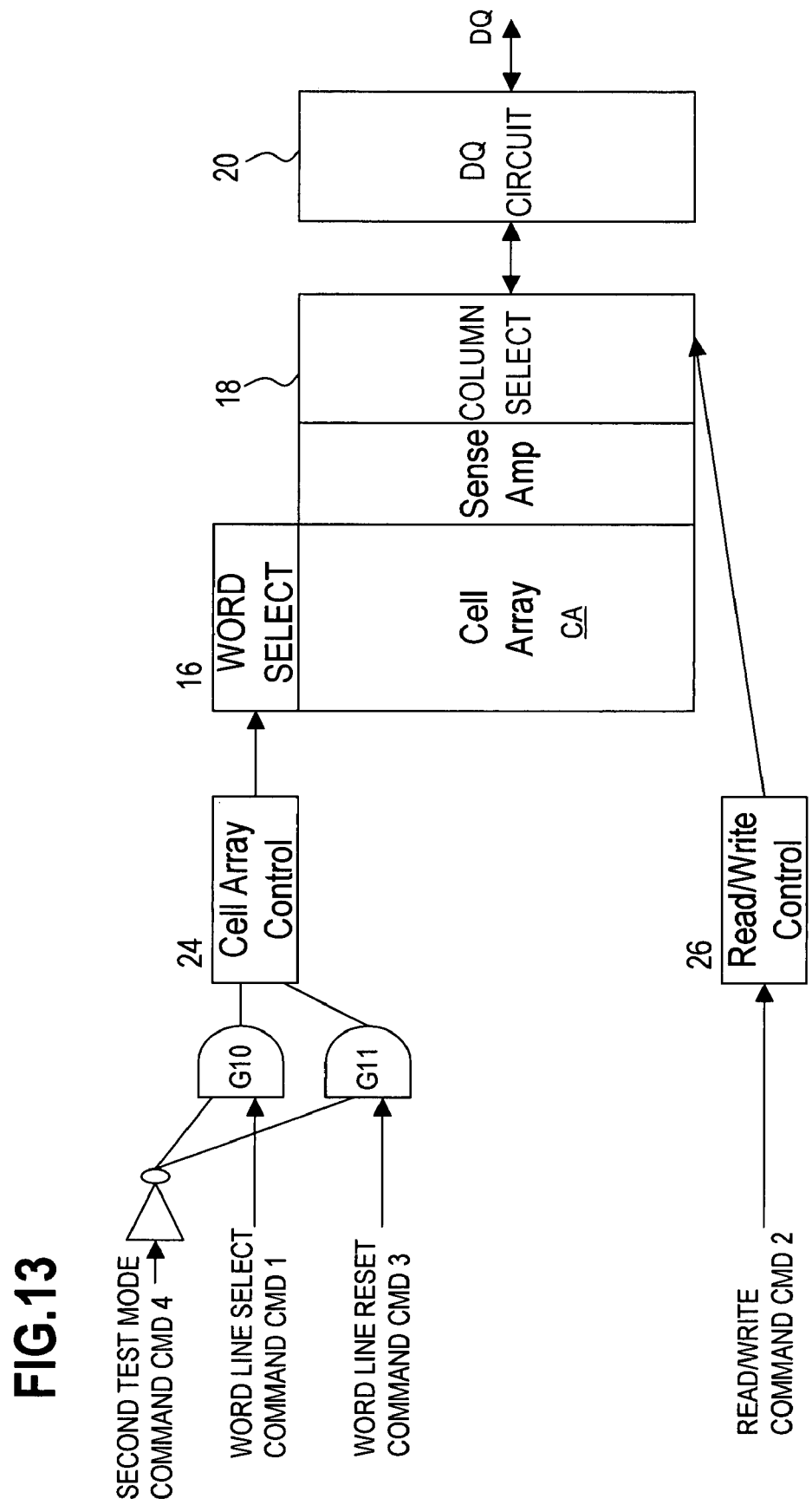
FIG. 13 is a block diagram depicting the memory device having commands CMD1, CMD2, CMD3 and CMD4.

FIG. 13 is a block diagram depicting the memory device having the above commands, CMD1, CMD2, CMD3 and CMD4. The dynamic memory in the case of an SDRAM operates responding to: a precharge command resetting the bit line pair to a precharge level, and resetting the word line to non-select level; an active command which is provided with a row address for selecting a word line and activating the sense amplifier; and a read command or write command which is provided with a column address for selecting a bit line pair and inputting/outputting data respectively. The word line select command CMD1 shown in FIG. 13 corresponds to the active command, the read/write command CMD2 corresponds to the read command or write command, and the word line reset command CMD3 corresponds to the precharge command respectively.

And when the second test mode command CMD4 is entered, the word line select command CMD1 and the word line reset command CMD3, which are entered after this, cannot be provided to the cell array control circuit 24 by the AND gate G10 and G11. In other words, even if the test device wants to reset the word line by providing the word line reset command CMD3, or wants to select a different word line by providing the word line select command CMD1 with specifying a new row address, these commands become invalid in the memory device, and the target word line TWL select status is maintained.

Therefore even if the test device repeats the sequence steps S24 and S26 in FIG. 11 a plurality of times, the memory device continues outputting the data of the target memory cell. So even if a different word line is driven, the test device receives the read data of the target memory cell, and the same judgment result as step S20 in FIG. 10 is received. This means that if the test device detects a—failure when the target memory cell is read, a failure is detected for a plurality of times for the same bit line pair. As a result, the test device detects a plurality of failure bits for the same bit line pair, and executes column redundancy.

Back in FIG. 11, the test device enters the command CMD1 for selecting a different word line in the bit line pair at the opposite side which shares the sense amplifier with the bit line pair of the target memory cell (S30). In this case as well, the memory device has been entered in the second test mode, so this command CMD1 becomes invalid, and the target word line is continuously selected. Therefore if the test device enters the command CMD2 for reading the bit line pair at the opposite side, the data of the target memory cell is read from the same sense amplifier (S32). By this, the test device detects a failure bit in the bit line pair at the opposite side. By repeating these steps S30 and S32 for a predetermined number of times, the test device detects a plurality of failure bits in the bit line pair at the opposite side, and replaces the bit line pair with a redundant bit line pair by executing column redundancy.

By executing column redundancy, which replaces bit line pairs on both sides of the target sense amplifier with redundant bit line pairs, the sense amplifier in which a failure is detected can be completely replaced with the redundancy side.

Figure 14:
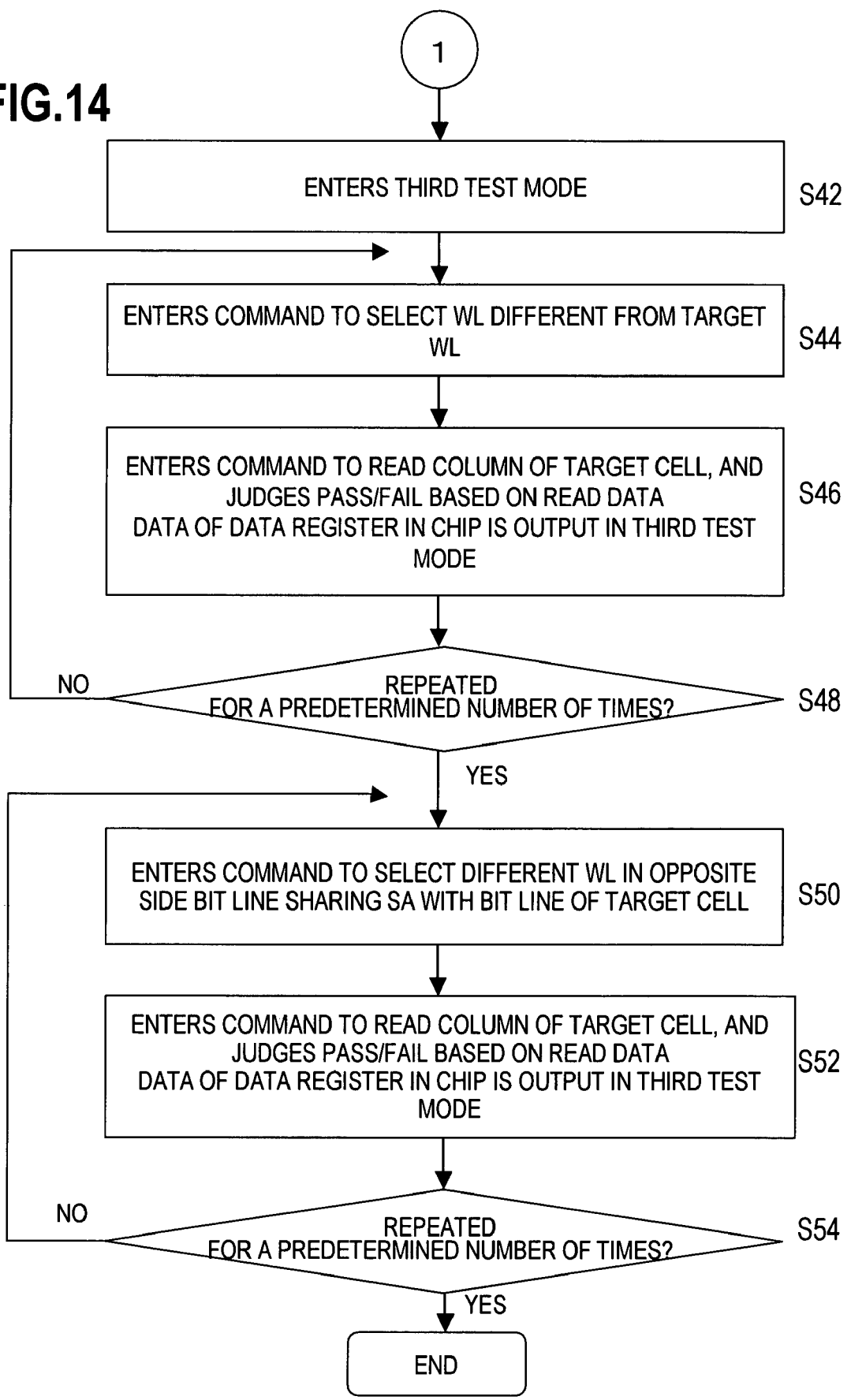
FIG. 14 is a flow chart depicting the second test sequence according to the present embodiment.

FIG. 14 is a flow chart depicting the second test sequence according to the present embodiment. In the second test sequence, the steps S42 to S54 in FIG. 14 are executed after the steps S10 to S20 in FIG. 10. In the first test sequence, the memory device entered the second test mode in FIG. 11, but in the second test sequence, the memory device enters the third test mode (S42) in FIG. 14.

Figure 15:
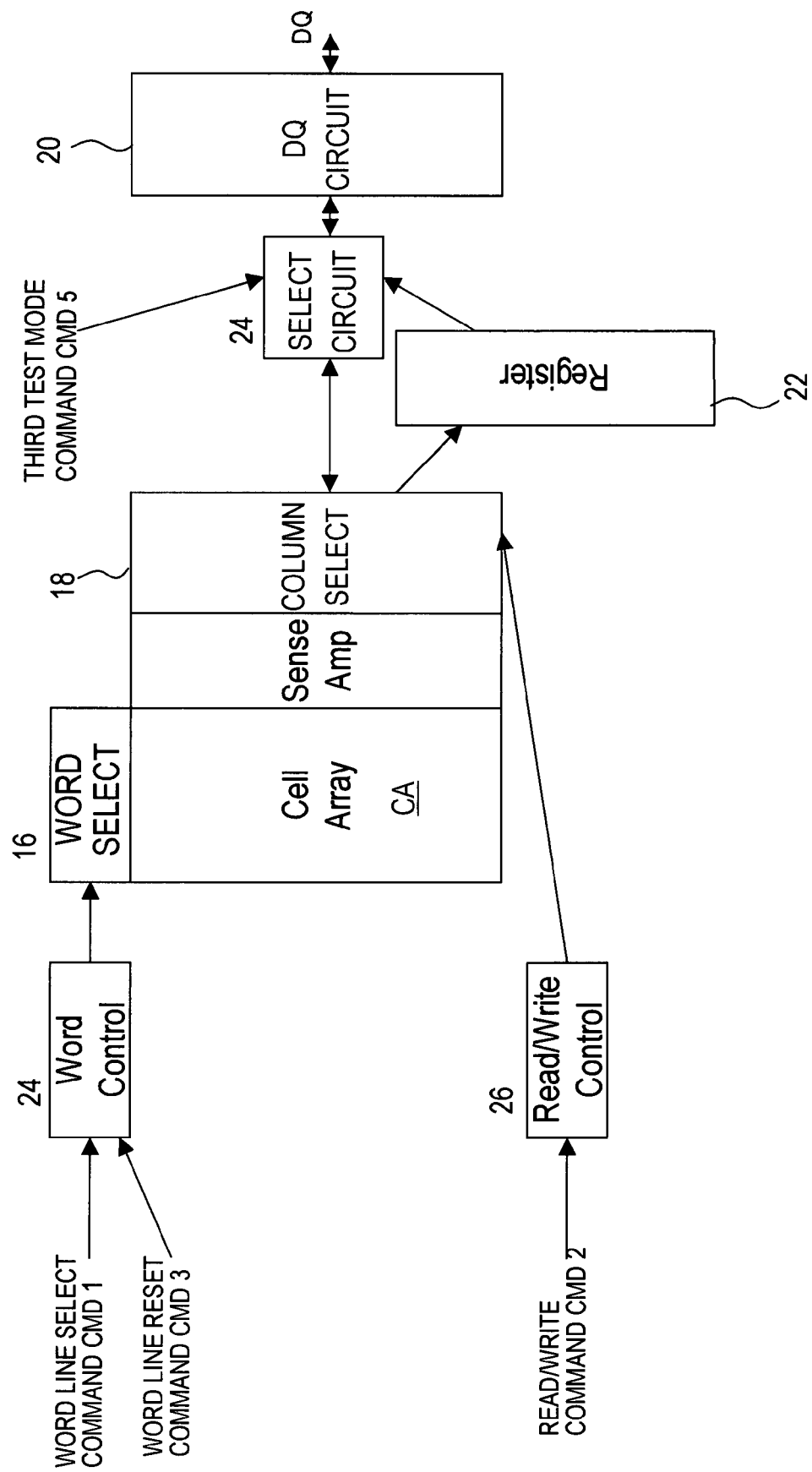
FIG. 15 is a block diagram depicting the memory device having the third test mode command CMD5.

FIG. 15 is a block diagram depicting a memory device having a third test mode command CMD5. The word line select command CMD1, read/write command CMD2 and word line reset command CMD3 are the same as FIG. 13. The memory device in FIG. 15 has a register 22 for storing read data, and a select circuit 24 which is switched responding to the third test mode command CMD5. In normal operation, the column select circuit 18 and the input/output circuit 20 are connected by the select circuit 24, and the read data of a column selected by the column select circuit 18 is guided to the input/output circuit 20. When the third test mode command CMD5 is entered, the select circuit 24 responds to this command, and selects the previous read data stored in the register 22, and guides it to the input/output circuit 20. Therefore when the memory device enters the third test mode, read data, which was previous stored, is output from the register 22 even if the word line is changed by the commands CMD1, CMD2 and CMD3.

A plurality of failure bits can also be generated in the bit line pair of the target memory cell by outputting the read data of the target memory cell to an address of a different word line in the same bit line pair using this third test mode. In the same way, a plurality of failure bits can also be generated in the bit line pair at the opposite side of the target sense amplifier.

Back in FIG. 14, the test device enters the third test mode command CMD5 and sets the memory device to the third test mode (S42). The test device enters the word line reset command CMD3, and also enters a command CMD1 for selecting a word line which is different from the target word line (S44). By this, the different word line is driven, and the sense amplifier is activated in the cell array CA. And the test device enters the read command CMD2 for reading a bit line pair data the same as the target cell, and judges an error based on the read data which is output (S46). However, when the memory device is in the third test mode, the read data of the target memory cell is stored in the register 22 in the memory device, and the read data thereof is selected by the select circuit 24, and is output. Therefore if the test device detects a failure in the read data of the target memory cell, a failure is also detected for a different word line of the same bit line pair. The above steps S44 and S46 are repeated for a predetermined number of times (S48), and as a result, the test device detects a plurality of failure bits and executes column redundancy.

Then the test device enters the word line select command CMD1 along with an address to select a word line in the bit line pair at the opposite side which shares the sense amplifier with the bit line of the target memory cell (S50). And the test device specifies the same column address and enters the read command CMD2 (S52). Just like step S46, in the third test mode, the read data of the target memory cell in the register 22 is output, so the test device receives the same failure result. As a result, the test device also executes column redundancy for the bit line pair on the opposite side.

As described above, according to the present embodiment, in the dynamic type memory device, an amplifier having an unbalanced characteristic can be detected, and yield of memory devices can be improved.

What is claimed are:

1. A semiconductor memory device, comprising:
    a memory cell array which includes a plurality of word lines, a plurality of bit line pairs, a plurality of memory cells placed at crossing positions of the word lines and the lines, and a plurality of sense amplifiers connected to the bit line pairs for amplifying a potential difference of the bit line pair;
    a bit line transfer control circuit for controlling a bit line transfer gate which connects the bit line pair to the corresponding sense amplifier; and
    a word line select circuit for selecting the word line,
    wherein in a test mode, the word line select circuit selects a first word line corresponding to a first memory cell of a first bit line connected to a first sense amplifier among the plurality of sense amplifiers, the first sense amplifier is activated, and the first bit line is amplified to a first or second potential,
    then in a state where the bit line transfer control circuit disconnects the first bit line from the first sense amplifier, the word line select circuit multiple-selects a second word line of a second memory cell which is coupled to the first bit line and stores data opposite to the first memory cell, to set the potential of the first bit line to an intermediate potential, and returns the first word line to a non-select state to write the intermediate potential in the first memory cell, then the data in the first memory cell is read after precharging the first bit line.

2. The semiconductor memory device according to claim 1, wherein a specific data pattern for applying a cross talk, which inverts a potential level, to a first bit line pair connected to the first sense amplifier, is written in a second memory cell which belongs to a second bit line pair adjacent to the first bit line pair and the first word line, and written in a fourth memory cell which belongs to a fourth bit line pair connected to a sense amplifier adjacent to the first sense amplifier and the first word line, then the intermediate potential is restored in the first memory cell, and then the data in the first memory cell is read for checking whether there is a read data error.

3. The semiconductor memory device according to claim 1, wherein a specific data pattern for applying a cross-talk, which inverts a potential level, to a first bit line pair connected to the first sense amplifier, is written in the second and third memory cells which belong to the second and third bit line pairs adjacent to the first bit line pair and the first word line, and written in a fourth memory cell which belongs to a fourth bit line pair connected to a sense amplifier adjacent to the first sense amplifier and the first word line, then the intermediate potential is restored in the first memory cell, and then the data in the first memory cell is read for checking whether there is a data error.

4. The semiconductor memory device according to claim 3, wherein the second, first, third and fourth bit line pairs are sequentially arrayed, sense amplifiers connected to the first and fourth bit line pairs are placed at one side of the ends of the bit lines, sense amplifiers connected to the second and third bit lines are placed at the other side of the ends of the bit lines, and the specific data pattern written in the second, first, third and fourth memory cells is L, L, H, L or H, H, L and H.

5. The semiconductor memory device according to claim 4, wherein data the same as that in the second, third and fourth memory cells is written in memory cells at the crossing positions of the second, third and fourth bit line pairs and the second word line.

6. The semiconductor memory device according to claim 4, wherein in the test mode, an operation of writing the intermediate potential in the first memory cell while driving at least one of the second word line, a third word line coupled to the third memory cell and a fourth word line coupled to the fourth memory cell is repeated.

7. The semiconductor memory device according to claim 1, wherein when an error is detected in the read data, the first bit line pair is replaced with a redundant bit line pair.

8. The semiconductor memory device according to claim 1, wherein when an error is detected in the read data, not only the first bit line pair, but also a bit line pair at the opposite side of the sense amplifier connected to the firs bit line pair is replaced with redundant bit line pairs.

9. The semiconductor memory device according to claim 1, wherein the memory cell array has redundant word lines and redundant bit line pairs, and in the test mode, after checking whether there is a read data error in the first memory cell, an operation of receiving a command for selecting a word line which is different from the first word line and reading data of the first memory cell with maintaining the first word line select state regardless the command, is repeated.

10. The semiconductor device according to claim 1, wherein the memory cell array has a configuration in which two bit line pairs share a sense amplifier, and further comprises redundant bit line pairs, and in the test mode, if a failure is detected in one of the bit line pairs to be connected to the first sense amplifier, a test result that a failure also exists in a bit line pair at an opposite side of the sense amplifier is supplied to the test device, so that the bit line pairs on both sides connected to the first sense amplifier are replaced with the redundant bit line pairs.

* * * * *